United States Patent [19]
Brown et al.

[11] Patent Number: 5,583,351
[45] Date of Patent: Dec. 10, 1996

[54] COLOR DISPLAY/DETECTOR

[75] Inventors: Robert G. W. Brown, Oxfordshire; Stephen P. Najda, Oxford, both of United Kingdom

[73] Assignee: Sharp Kabushiki Kaisha, Osaka, Japan

[21] Appl. No.: 230,909

[22] Filed: Apr. 21, 1994

[30] Foreign Application Priority Data

Apr. 22, 1993 [GB] United Kingdom .................. 9308300

[51] Int. Cl.[6] .................................................. H01L 33/00
[52] U.S. Cl. .......................... 257/89; 257/90; 257/184; 257/440; 257/443; 257/201
[58] Field of Search ..................................... 257/440, 184, 257/89, 90, 201, 443

[56] References Cited

U.S. PATENT DOCUMENTS

| 3,683,240 | 8/1972 | Pankove | 317/234 R |
| 3,890,170 | 6/1975 | Russ | 148/175 |
| 4,211,586 | 7/1980 | Fang et al. | 148/175 |
| 5,005,057 | 4/1991 | Izumiya et al. | 357/17 |
| 5,138,416 | 8/1992 | Brillson | 357/30 |

FOREIGN PATENT DOCUMENTS

| 0166787 | 1/1986 | European Pat. Off. . |
| 0496030 | 7/1992 | European Pat. Off. . |
| 2250635 | 6/1992 | United Kingdom . |

OTHER PUBLICATIONS

D. W. Jenkins et al.; Superlattices And Microstructures, vol. 3, No. 4, pp. 365–369, 1987, "Band Structure of InN".
S. Strite et al.; Bull A.P.S. vol. 37, No. 1, G209, 1992, "The Structural And Optical Properties Of Zincblende GaN And InN".
CRC Handbook of Chemistry and Physics, 1978–79, 59th Ed., 1978 pp. E101–E105.

*Primary Examiner*—William Mintel

[57] ABSTRACT

A color semiconductor display device in which optoelectronic elements capable of emitting/absorbing light of different predetermined wavelengths in the visible wavelength range (e.g. red, green, blue) are formed on a common substrate and comprise similar alloy compositions which are lattice matched to the substrate material. The alloy is preferably a III-V nitride alloy lattice matched to Si or GaP substrate material. In the disclosed embodiment, a color display device comprises a silicon or GaP substrate with an array of pixels, each being formed by a group of three (red, green, blue) color sub-pixels provided on the substrate. The pixels are formed of InAlNSb alloy, with a quantum well regions of InNSb and barrier regions of AlNSb, or are formed of AlGaAsSbN alloy, with quantum well regions of GaAsN and barrier regions of AlNSb. Tuning of the wavelength emission/absorption characteristics of the sub-pixels is by doping of the quantum well material with aluminum and/or by quantum confinement.

34 Claims, 11 Drawing Sheets

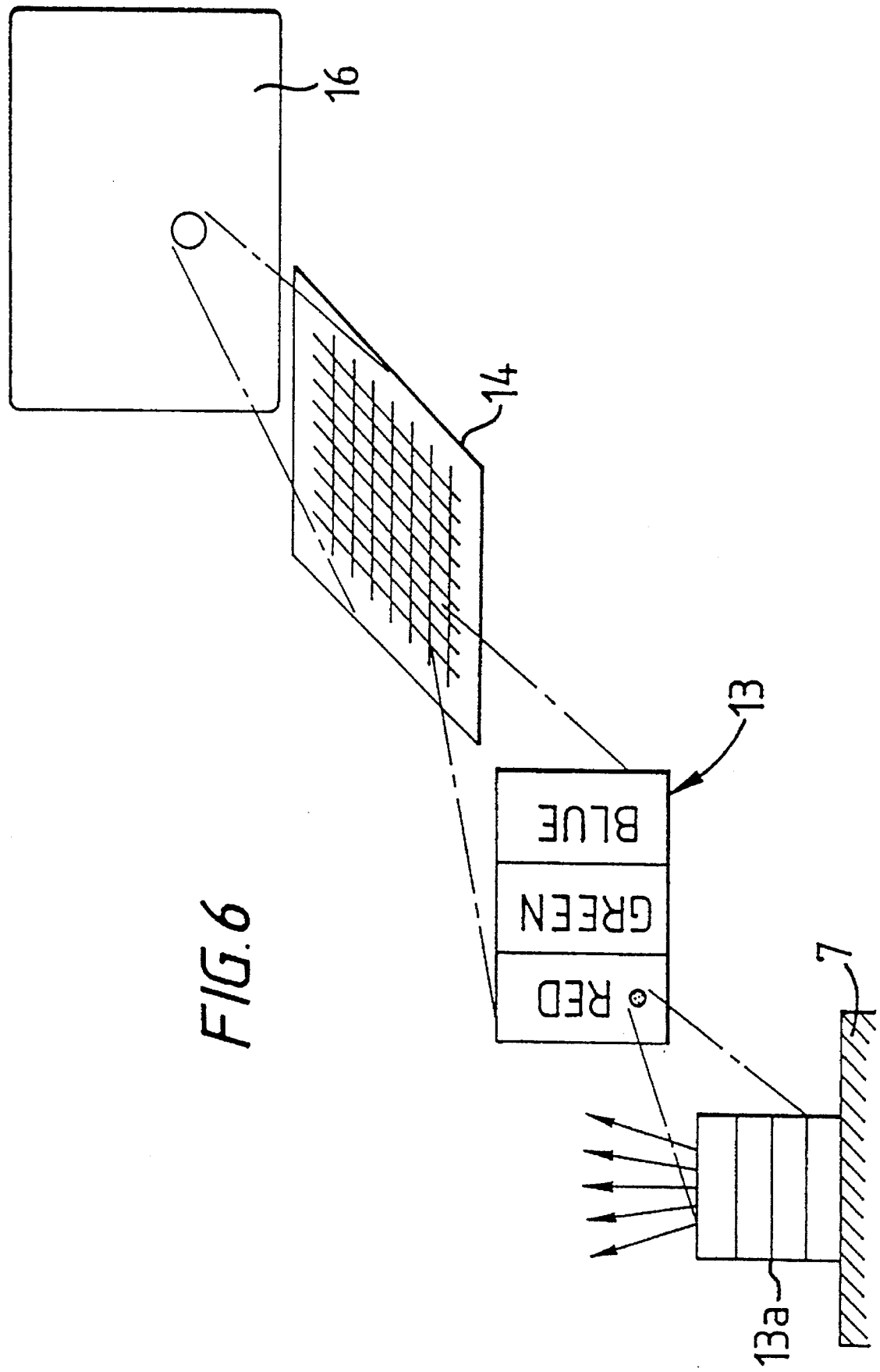

COLOR DISPLAY/DETECTOR

BACKGROUND OF THE INVENTION

This invention relates to displays or detectors and to optoelectronic devices suitable for use therein. In particular it relates to semiconductor optoelectronic elements and to the manufacture thereof, and to a semiconductor color display/detector comprising a plurality of such optoelectronic elements. The invention also concerns an alloy material for use in the fabrication of such optoelectronic elements, color displays and detectors.

Known color displays can be split into two main types: i) vacuum or valve displays such as the cathode ray tube or gas discharge lamp and ii) thin, flat screen displays such as liquid crystal or electroluminescent displays. The foregoing display types have a number of drawbacks associated with their manufacture and use. Whilst the manufacture and mass production of CRTs and gas discharge lamps is a well established and reliable technology, these display devices are bulky and relatively fragile. Additionally, CRTs, gas discharge tubes and the like consume large amounts of power and are therefore unsuitable for portable or mobile applications. The aforementioned flat displays overcome some of these problems in that they are generally more robust, consume less power and are less bulky than CRTs and the like. They are also susceptible to mass production since similar techniques as are used in integrated circuit production can be applied to their manufacture. However, their manufacture is somewhat more complicated than IC production, since the optically active material has to be sandwiched between two substrates. In addition, the substrates support the electrodes necessary to stimulate the optically active material and their associated signal lines, thereby resulting in a complex multilayer structure. Drawbacks of known flat displays are that they have poor color uniformity, low resolution, viewing angle and brightness, and are slow to respond to updated information in comparison to CRTs and the like.

Known color detectors can be split up into three main types:

(i) vacuum or valve detectors such as Orthicon or Vidicon ™ tubes;

(ii) thin, flat detectors such as photo diodes optimised or doped to detect a particular wavelength, or band of wavelengths, of light; and (iii) thin, flat detectors such as Charge Coupled Devices (CCD) utilising color filters.

The foregoing color detectors have a number of drawbacks associated with their manufacture and use, particularly when used as part of full color detectors.

In the case of Vidicon ™ tubes, a full color detector comprises either three separate tubes, each tube having one primary color input thereto, or a single tube having a special target system in the form of a matrix having color-discriminating properties. Light incident on a full color detector utilising a Vidicon ™ tube or tubes, is split into its primary color components by optical filters. Consequently the detector is bulky and heavy due to the electrical components required to produce and control the scanning electron beam and the optical components required in the detector. It is also sensitive to vibrations causing misalignment of the electron beam and the optical components.

Photo-diodes are unsuitable for use in a full color detector because a triad of three photo-diodes, one of each optimised for a different primary color, is necessary to form a single color picture cell. Because the constituent materials, doping materials or amount of doping are different for photo-diodes optimised for different colors it is very difficult to fabricate triads where each photo-diode is close enough to its neighbours to appear to be part of the same picture cell. For this reason, photo-diodes and the like are unsuitable for color camera applications.

Full color detectors utilising CCD's have a number of advantages over vacuum or valve devices, because they are of smaller size and have greater physical and optical ruggedness. Nevertheless, CCD full color detectors still require some form of color filtering in either the multi-tube or single tube format. Again this leads to undesirable bulkiness and weight. A further disadvantage of CCD full color detectors, is that when they are used as the target in color cameras they exhibit inadequate definition and have poor resolution.

Many of the drawbacks associated with known color displays and detectors are due to the fact that hitherto optoelectronic elements capable of being adapted to operate in the visible red to visible blue (and also U-V) region of the spectrum and made from substantially the same materials, were unknown. This resulted in optoelectronic devices being built on different substrates and having to have complicated and bulky interconnections therebetween. Furthermore, known optoelectronic devices were not fabricated on silicon substrates. As a result, well known silicon VLSI technology techniques could not be monolithically incorporated into the optoelectronic devices.

In particular, optoelectronic devices comprising semiconductor material having band-gaps which are wide enough to emit/absorb blue light have proven very difficult to grow and dope in a controlled and systematic manner. II-VI compound semiconductors whilst having suitable band-energies for blue light, are not suitable for depositing on a silicon substrate and invariably have to operate at low temperatures. Wide band-gap nitride semiconductors have been studied as alternatives to II-VI compounds with varying degrees of success. Although blue light has been emitted from GaN devices, such devices had to be built on sapphire substrates, which is prohibitively expensive for commercial applications, and the quality of the resulting material was poor due to lattice mismatch with the substrate and the introduction of nitrogen vacancies due to the relatively high growth temperatures.

Examples of certain known solid state color detection devices which do not use color filters, and which include arrays of detection devices sensitive to different color portions of the electromagnetic spectrum are disclosed in EP-A-0166787 and U.S. Pat. No. 5,138,416. In EP-A-0166787, the devices are electrostatic induction phototransistors (SIT), which operate on the principle that the gate potential of the SIT is determined by light directed thereto. Structural dimensions of the SIT's, such as diffusion depths of the SIT gate regions, are varied to provide the required selectivity of spectral sensitivity. Blue light response is improved by limiting the depletion layer thickness.

In U.S. Pat. No. 5,138,416, a multilayer color photosensitive element is made from group III-V alloy semiconductors. Charge is collected from the photosensitive element according to an amount of time it takes for red, green and blue light photoexcited carriers to travel through the layers. The resulting waveform obtained from the element will show temporal features which depend on the colors of illumination.

Examples of certain known solid state color display devices including electroluminescent elements emitting different colors are disclosed in U.S. Pat. No. 3,890,170 and U.S. Pat. No. 4,211,586. In U.S. Pat. No. 3,890,170, two matrices of respectively, red LED's and green LED's are integrated and can provide a red, green or orange display. The red LED's are gallium arsenide phosphide and the green LED's are gallium phosphide, and the total LED array is formed on a monolithic semiconductor substrate of gallium arsenide or phosphide. Row and column address lines are provided on the substrate for each matrix so that a strobing logic address system can effect lighting of the individual LED's for producing an alphanumeric character or graphic display.

In U.S. Pat. No. 4,211,586, an array of red, green, orange and yellow light emitting diodes is formed on a common gallium arsenide substrate. A vertically graded epitaxial region of $GaAs_{1-x}P_x$ is selectively etched to different depths, and diodes of different color emission are formed at selected concentration levels in the epitaxial region.

In neither of these color display devices is full color display possible, as the materials employed are not capable of blue light emission.

Specific LED constructions for blue light emission are disclosed in GB-A-2250635 and U.S. Pat. No. 5,005,057. In GB-A-2250635 a luminescent layer epitaxially grown on a buffer layer, in turn formed by epitaxy on a semiconductor substrate of zinc sulphide, zinc selenide or a mixed crystal thereof, is formed from aluminium nitride, indium nitride, gallium nitride or a mixed crystal of at least two of such nitrides.

In U.S. Pat. No. 5,005,057, a blue LED has either a superlattice structure of alternately stacked BP and $Ga_xAl_{1-x}N$ ($0 \leq x \leq 1$) layers, or a mixed crystal structure of $Ga_xAl_{1-y}B_{1-x-y}N_zP_{1-z}$ ($0 \leq x,y,z \leq 1$ and $x+y \leq 1$). Single and double heterojunction structures are disclosed.

The present invention aims to alleviate the earlier-mentioned disadvantages of known color displays and to provide a color display that is thin, lightweight, robust, simple to manufacture, consumes low power and yet has high levels of brightness and resolution and a wide range of viewing angles.

The present invention also aims to alleviate the earlier-mentioned disadvantages of known color detectors and provide a color detector that is lightweight, robust, simple to manufacture, has a simplified construction and has a high level of resolution.

The present invention is based on the recognition that certain group III-V nitride alloys can, by suitable choice of elemental composition ratios, be fabricated so as to be substantially lattice matched to a commonly used material substrate (Si or GaP) and so as to form the basis of an optoelectronic element which can by appropriate doping or quantum confinement techniques be made to emit/absorb light at any desired wavelength in the visible red to ultraviolet region of the electromagnetic spectrum, including blue.

In one aspect, the present invention provides a color semiconductor display/detector device having a plurality of optoelectronic elements, said plurality including a first element and a second element, said first and second elements being capable of emitting/absorbing light having respective different predetermined wavelengths in the range corresponding to visible light, wherein said first and second optoelectronic elements are formed on a common substrate, and comprise III-V nitride alloy compositions, said compositions being substantially lattice matched to said common substrate.

In another aspect, the invention provides an optoelectronic element suitable for use in such a display/detector having an active region comprising InNSb or GaAsN. Preferably the active region comprises a quantum well region of InNSb or GaAsN and a barrier region of AlNSb.

A particular advantage of a display/detector according to the present invention is that it can be manufactured in a "one step" epitaxial growth process without the need to assemble separate components and inject optically active material between substrates.

In a preferred embodiment of the invention the substrate comprises either Silicon (Si) or Gallium Phosphide (GAP), and the III-V nitride alloy includes Sb. The alloy preferably comprises either InAlNSb or AlGaAsSbN.

In particular, the device of the present invention comprises a plurality of active quantum well regions confined by barriers consisting substantially of $AlN_{1-x}Sb_x$, where x lies in the range $0.57 \leq x \leq 0.63$ and having a quantum well region comprising substantially $InN_{1-y}Sb_y$ where y lies in the range $0.32 \leq y \leq 0.38$ for optoelectronic elements of InAlNSb alloy, and comprising substantially $GaAs_{1-z}N_z$ where z lies in the range of $0.17 \leq z \leq 0.23$ for optoelectronic elements of AlGaAsSbN alloy.

In a further aspect of the invention there is provided an optoelectronic element comprising a III-V nitride alloy capable of being substantially lattice matched to Si or GaP, and of being selectively adapted to emit/absorb light in the visible red to ultraviolet region of the spectrum, the element having an active region comprising InNSb. The active region preferably comprises an active quantum well region of $InN_{1-y}Sb_y$, where y lies in the range $0.32 \leq y \leq 0.38$ and barrier regions of $AlN_{1-x}Sb_x$ where x lies in the range $0.57 \leq x \leq 0.63$.

In another aspect of the invention there is provided an optoelectronic element comprising a III-V nitride alloy capable of being substantially lattice matched to Si or GaP, and of being selectively adapted to emit/absorb light at a desired wavelength in the visible red to ultra violet region of the electromagnetic spectrum, said element having an active region comprising an active quantum well region of GaAsN and barrier regions of AlNSb. Preferably, the active quantum well region comprises $GaAs_{z-1}N_z$ where z lies in the range $0.17 \leq z \leq 0.23$, and barrier regions of $AlN_{1-x}Sb_x$ where x lies in the range $0.57 \leq x \leq 0.63$.

In a yet further aspect of the invention, there is provided a nitride alloy comprising $InN_{1-y}Sb_y$ where y lies in the range $0.32 \leq y \leq 0.38$, and a nitride alloy comprising $AlN_{1-x}Sb_x$ where x lies in the range $0.57 \leq x \leq 0.63$.

BRIEF DESCRIPTION OF THE DRAWINGS

A specific embodiment of the invention adapted for use as a color display will now be described by way of example with reference to the accompanying drawings, in which:

FIG. 6 illustrates, with progressive magnification, the construction of a display from sub-pixels comprising quantum confinement structure(s), which assemble into RGB pixels which assemble into an array of color pixels;

DETAILED DESCRIPTION OF THE PREFERRED EMBODIMENTS

The following description describes a semiconductor color display system comprising a plurality of optoelectronic devices fabricated from a nitride alloy. The optoelectronic devices are fabricated with band gaps suitable for light emission from red through to blue, and are supported by and lattice matched to a silicon (Si) substrate.

Wavelength tunability is achieved by the quantum confinement properties of the semiconductor nanostructure and/or by varying the alloy composition. High quality nanostructure crystals can be grown by Molecular Beam Epitaxy techniques. A description of quantum confinement techniques and semiconductor nanostructures, and an explanation of the terminology used in the following description can be found in, for example, "Physics and Applications of Semiconductor Microstructures", M Jaros, Oxford University Press.

There follows a more specific description of the semiconductor system used in a color semiconductor display to be described later.

Figure 1:
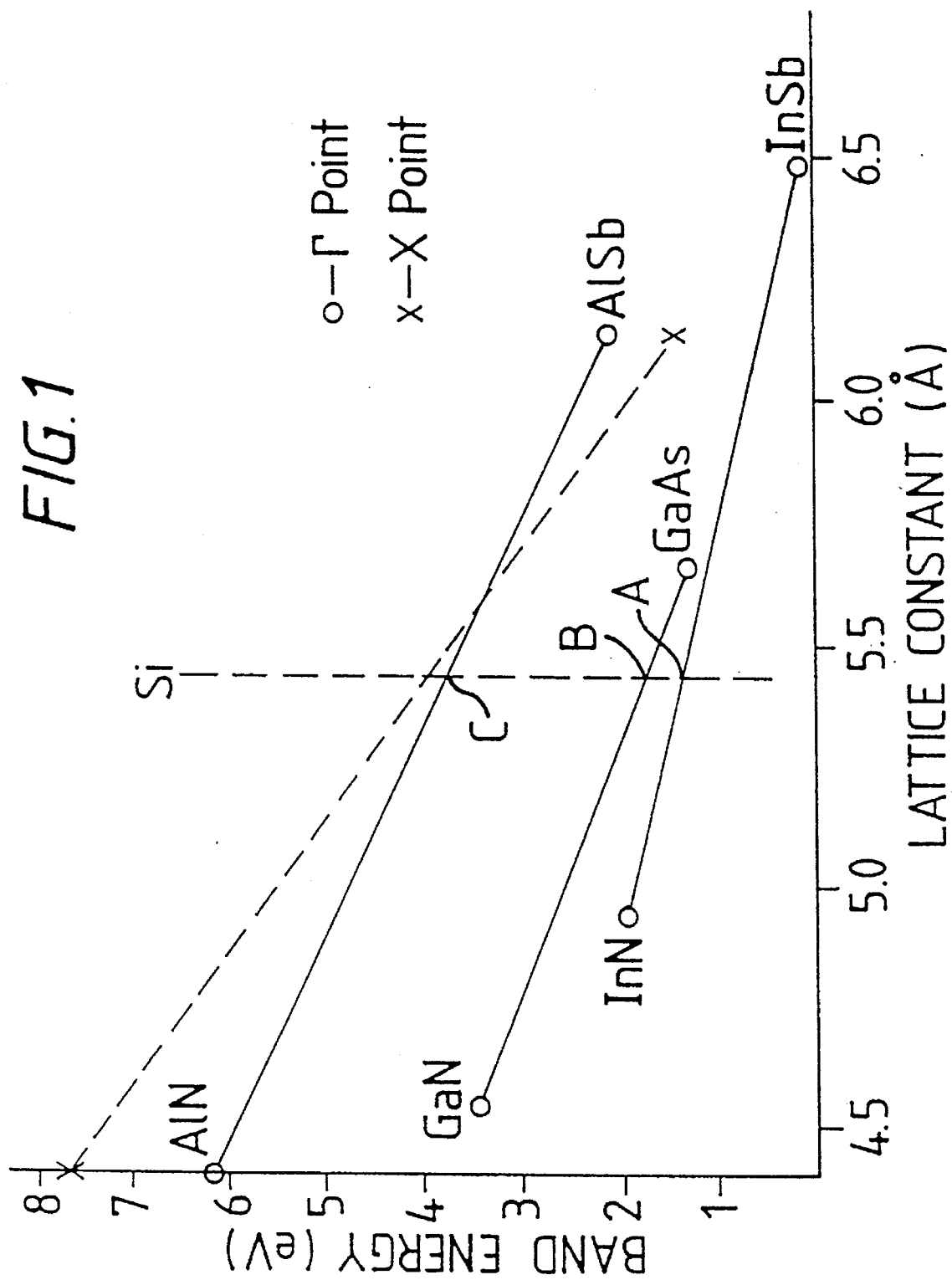
FIG. 1 is a diagram of energy gap (eV) plotted against lattice constant (Å) for the semiconductor of interest.

FIG. 1 shows a diagram of energy gap (eV) against lattice constant (Å) for the semiconductors of interest. The vertical line at 5.4 Å corresponds to the lattice constant of silicon. The open circle denotes the $\Gamma$ point and crosses denote the X point conduction band minimum for each respective semiconductor. The X points shown are for AlSb and AlN. A linear interpolation between the binary compounds is used to achieve an estimate of the alloy band-gaps. It should be noted that the linear interpolation gives only an estimate of the band-gap energy since the phenomenon of alloy bowing (ie., in reality there is a non-linear interpolation between the band gap energy of respective binary compounds) will alter the band-gap energy by a few percent.

In FIG. 1, the point A on the InN-InSb line represents an InNSb alloy containing ~65% nitrogen. It can be seen from the figure that such an InNSb alloy containing ~65% nitrogen is lattice matched to silicon and has a direct band gap corresponding to ~1.5 eV. Such an InNSb alloy can be quantum confined by an AlNSb barrier to form a quantum well structure. Also, the point B on the GaN-GaAs line represents a GaAsN alloy containing ~20% nitrogen. It can be seen from the figure that such a GaAsN alloy containing ~20% nitrogen is lattice matched to silicon and has a direct band gap corresponding to ~1.83 eV (680 nm). Such a GaAsN alloy can be quantum confined by an AlSbN barrier to form a quantum well structure. AlSb is an indirect compound semiconductor with an X point of 1.6 eV and a $\Gamma$ point of 2.2 eV from the valence band edge. Also from FIG. 1, an interpolation of the $\Gamma$ point from AlN to AlSb, shows that an alloy composition of $AlN_{0.4}Sb_{0.6}$ represented by point C has a direct gap of ~4.0 eV and is lattice matched on the one hand to both $InN_{0.65}Sb_{0.35}$ and silicon and on the other hand to both $GaAs_{0.8}N_{0.2}$ and silicon.

The emission wavelength of an optoelectronic device fabricated using InNSb can be tuned by replacing a small fraction of the indium by aluminium thereby increasing the energy gap of the structure without changing the lattice parameter significantly, or quantum confinement techniques can be used, wherein the quantum well width is changed by altering the thickness of the InNSb alloy layer, or quantum well wires and dots are fabricated from the semiconductor system. Alternatively, a combination of Al doping and quantum confinement can be used. Thus, it is possible to tune the band gap energy of the quantum well region material, InNSb, to correspond to energy transitions suitable for emitting light at red, green or blue wavelengths. This is particularly advantageous in relation to the emission of blue light, since a blue light emitting material, lattice matched to silicon, has not been previously fabricated.

In a particular preferred embodiment an $InN_{0.65}Sb_{0.35}/AlN_{0.4}Sb_{0.6}$ quantum well structure is used, to provide optimum lattice matching to a silicon substrate. However, lattice mismatch of up to 5% or so is tolerable; larger mismatches usually introduce defects which degrade the performance of the device. The allowability of such lattice mismatch provides possible variation of the constituent ratios in the above alloys of the device. More particularly, the preferred alloy composition for the barrier can be represented as $AlN_{1-x}Sb_x$ where x satisfies the relation $0.57 \leq x \leq 0.63$, while the preferred nitride alloy composition for the quantum well can be represented as $InN_{1-y}Sb_y$, where y satisfies the relation $0.32 \leq y \leq 0.38$.

An alternative embodiment, using a GaAsN/AlNSb quantum well structure, can also be lattice matched to silicon as can be seen from FIG. 1. Taking an allowable degree of lattice mismatch into account, the preferred alloy composition for the barrier can again be represented as $AlN_{1-x}Sb_x$ where x satisfies the relation of $0.57 \leq x \leq 0.63$, while the preferred nitride alloy composition for the quantum well can be represented as $GaAs_{1-z}N_z$, where z satisfies the relation $0.17 \leq z \leq 0.23$. Wavelength tuning can be achieved by replacing a small fraction of the gallium by aluminium and/or by quantum confinement.

Figure 2C:
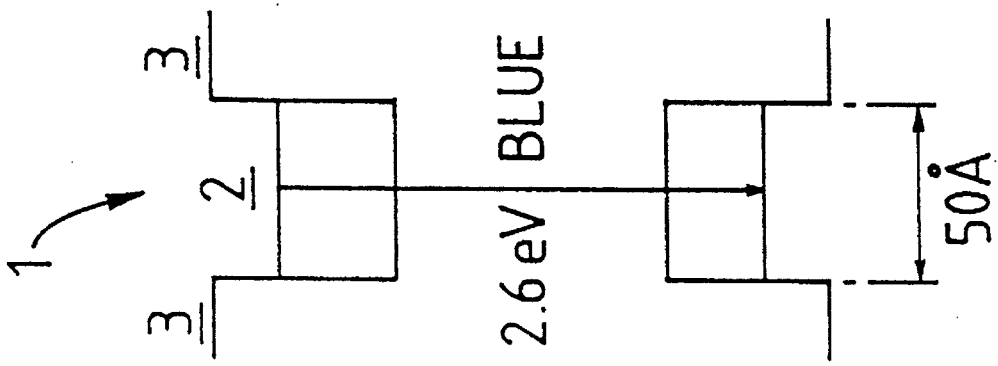
FIGS. 2a–2c are schematic diagrams of a $InN_{0.65}Sb_{0.35}/AlN_{0.4}Sb_{0.6}$ quantum well structure for three different well widths, to achieve red, green and blue emission.
Figure 2B:
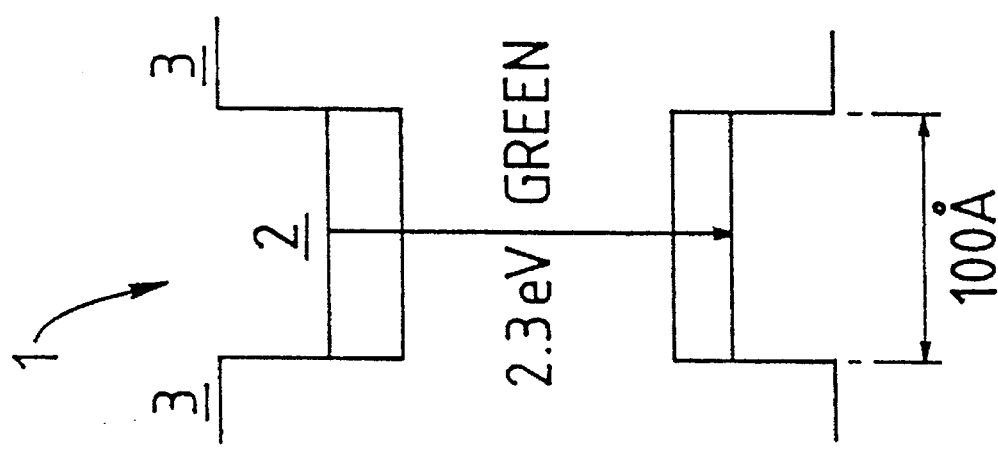
Figure 2A:
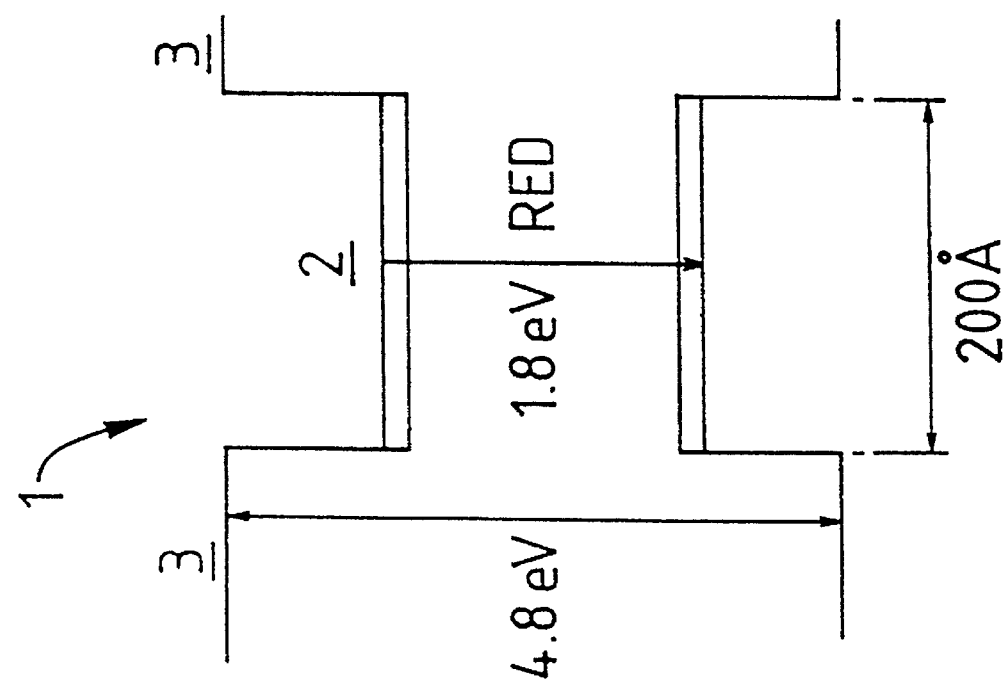

A schematic diagram of an $InN0.65Sb_{0.35}/AlN_{0.4}Sb_{0.6}$ quantum well structure for three different well widths, namely 200 Å, 100 Å and 50 Å is shown in FIGS. 2a to 2c. The structure 1 in each of these three figures comprises a quantum well region 2 formed by a well layer of $InN_{0.65}Sb_{0.35}$ sandwiched between two barrier layers 3 of $AlN_{0.4}Sb_{0.6}$. From FIGS. 2a to 2c it can be seen that such a structure provides an increase in the band gap energy of the quantum well material for a corresponding decrease in the well width. This figure demonstrates the wavelength tunability using quantum confinement that can be achieved with the AlInNSb semiconductor system. As mentioned before, tunability can alternatively be achieved in a structure with the quantum well width kept constant by introducing aluminium into the well alloy to increase the band-gap energy. In this way, similar alloy compositions all with the basic InNSb composition but differently doped can be used to produce light at different visible wavelengths.

Silicon is a very important material in electronics, and the specific embodiment is therefore based on quantum confinement structures utilising the InAlNSb alloy system and being substantially lattice matched to and constructed upon a silicon wafer substrate. A further advantage of using a silicon substrate is that wafers up to 8" diameter have been reliably manufactured and such sized wafers would be suitable for use in displays for portable "hand held" type TV's.

The stability of the alloys $InN_{1-y}Sb_y/AlN_{1-x}Sb_x$ required to be lattice matched to silicon $(0.57 \leq x \leq 0.63)$, $(0.32 \leq y \leq 0.38)$ can be demonstrated theoretically using standard theory of Stringfellow (J. Electronic Materials Vol 11, No 5, Pg 903 etc 1982).

Stringfellow gives a formula for the critical temperature Tc above which the alloy is stable against spinodal decomposition.

Consider the Gibbs free energy which tends to destabilise the alloy with the strain energy which acts to stabilise it. From equation 6 of the above reference $$T_c = T_g - T_s$$

where $$T_g = \frac{8.75 K \Delta a^2 x(1-x)}{R a_0^{4.5}}$$

$$T_s = \frac{E \Delta a^2}{2(1-v) R N_v a_0^2}$$

where
 K=1.15×10$^7$ cal/mol Å$^{2.5}$
 R=Gas constant
 E=Youngs modulus
 v=Poisson's ratio
 $N_v$=number of moles/unit volume
 $a_0$=lattice constant of the alloy
 $\Delta_a$=difference between the lattice constant of the binary end members
 x=fractional composition
Gives $$T_g = 5.05 \times 10^7 \frac{1}{a_0^{2.5}} \left( \frac{\Delta a}{a_0} \right)^2 x(1-x) \quad \text{(degrees K.)}$$

$$T_s = 1.36 \times 10^3 a_0^3 \left( \frac{\Delta a}{a_0} \right)^2 \quad \text{(degrees K.)}$$

For the alloy to be stable at any temperature requires $T_S > T_G$ or $T_S/T_G > 1$.
Therefore $$T_S/T_G = \frac{2.69 \times 10^{-5} a_0^{5.5}}{x(1-x)}$$

where $a_0$ is in Å.
 For growth on Silicon $a_0$=5.4
 Gives
 $InN_{0.65}Sb_{0.35}$=1.26
 $AlN_{0.4}Sb_{0.6}$=1.195

Thus the wells and barriers of an AlInNSb alloy are stable when lattice matched to silicon.

Similar calculations based on the Stringfellow theory have been performed to demonstrate the stability of the alloys proposed earlier for the AlGaAsNSb system, i.e. $GaAs_{1-z}N_z/AlN_{1-x}Sb_x$ $(0.57 \leq x \leq 0.63)$, $(0.17 \leq z \leq 0.23)$.

The method to be used for the fabrication of the alloy layers can be based upon existing techniques known in the art. For example, in the proposed AlInNSb system, techniques developed from those used to make InSb and nitride materials well known in the technical literature, [see (1) GaN, AlN and InN, a Review J Vac Sci Tech B 10, 4, 1237 (1992); (2) Eg=2.2 eV—Band Gap for InN D W Jenkins, R D Hong, J D Dow, Superlatt Microstruc. 3, 365, (1987); (3) a=4.98 Å—Lattice constant for InN S Strite, J Ruan, David J Smith, J Soiel, N Manning, W T Choyke and N Morkoc Bull A.P.S. 37,346, (1992)] will be used.

A method of fabrication of the alloy systems described in accordance with the invention would involve use of either CVD (chemical vapor deposition/epitaxy) or MBE/CBE (molecular or chemical beam epitaxy) technologies (see Crystal Growth by A W Vere, Plenum Press 1987). Elemental sources of Al, In and Sb are well known for use with these growth systems. Recently nitride materials have been under intensive study and two sources of nitrogen are known—use of ammonia and use of a radical ion source (or plasma).

The operating parameters and sequencing for the layer growth system using a chosen machine can be readily established by those skilled in the art of growth to achieve the precise growth conditions and required alloy ratios, demonstrated earlier with reference to the Stringfellow theory to be stable.

The above-described quaternary InAlNSb alloy system with InNSb wells and AlNSb barriers are generally easier to fabricate than the quinternary AlGaAsSbN alloy system with GaAsN wells and AlNSb barriers. One less elemental source overall is needed when employing the former alloy, and the control of the layer growing process is less complicated, since two of the elements, namely N and Sb continue to be deposited in both the well and barrier growing steps; only one element is switched, namely In⟵⟶Al.

Having described the theoretical basis for the choice of particular semiconductor alloy systems which satisfy the requirement of lattice matching to a substrate, and range of wavelength of light emission/detection, and having referred to the envisaged fabrication method, we will now describe suitable device structures embodying these systems.

A color element, or sub-pixel, of a semiconductor display comprises a quantum confined structure with the band-gap emission wavelength tuned to one of the three primary color wavelengths, ie. red, green, blue.

Figure 3:
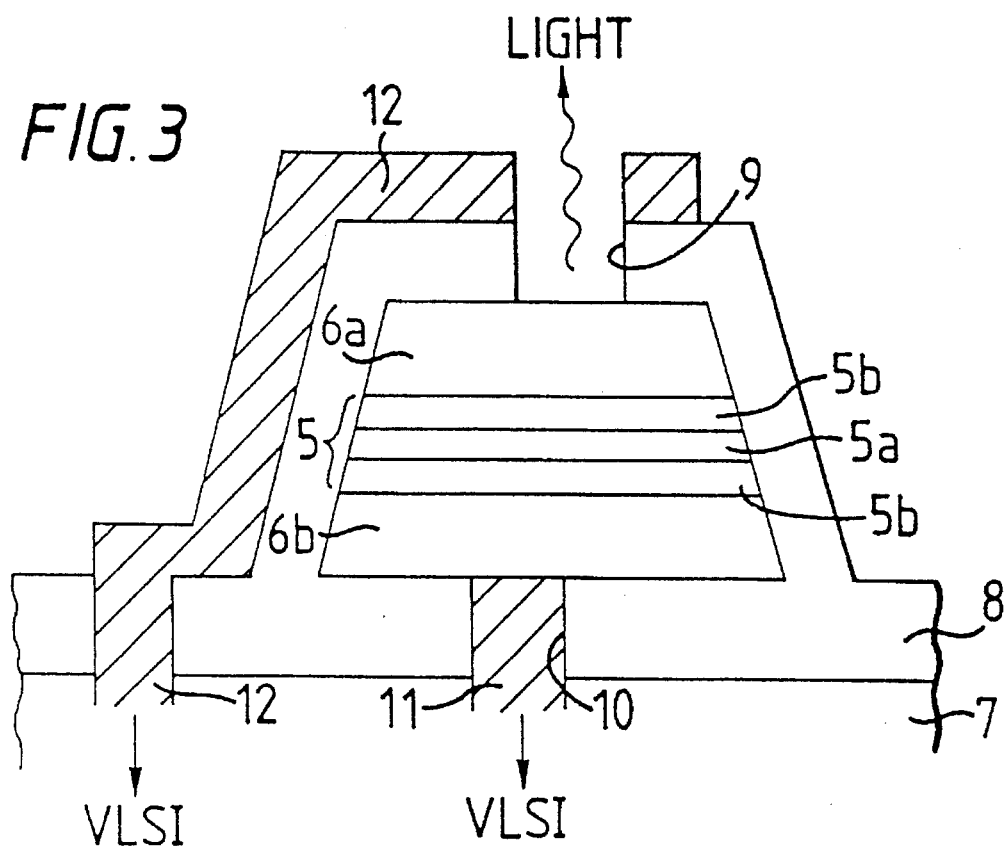
FIG. 3 is a schematic diagram of a sub-pixel, vertical cavity laser structure, specifying the layer composition to form the quantum well active region.
Figure 4:
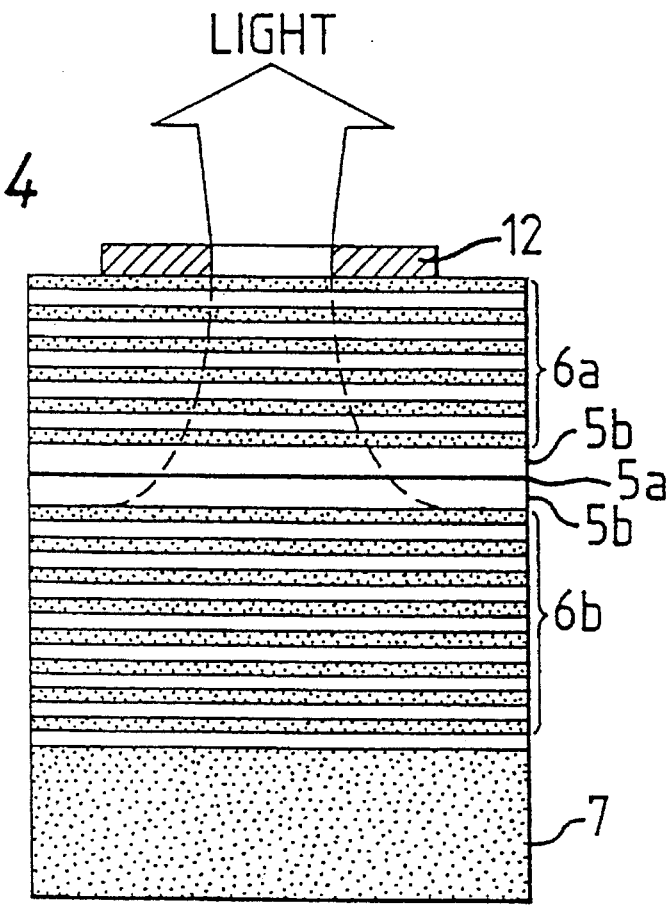
FIG. 4 shows further details of the semiconductor layers within the sub-pixel structure shown in FIG. 3.

A schematic diagram of a typical 'sub-pixel', vertical cavity laser structure is illustrated in FIG. 3, and a full structure layer diagram for 1 sub-pixel is shown in FIG. 4.

The InNSb/AlNSb structure of the vertical cavity laser or surface emitting laser shown in FIG. 3 comprises a quantum well region 5 capped top and bottom by optical reflectors 6a,6b. As illustrated, the quantum well region 5 comprises an active quantum well layer 5a of $InN_{0.65}Sb_{0.35}$ sandwiched between two barrier layers 5b of $AlN_{0.4}Sb_{0.6}$. The Bragg reflectors 6a, 6b at the top and bottom of the region 5 are arranged such that light propagates in the laser cavity in a direction substantially perpendicular to a silicon substrate 7 on which the laser structure is formed, which gives this particular type of laser its name. The laser cavity 5, 6 is surrounded by $SiO_2$ 8 insulator having apertures 9 and 10 at the top and bottom of the laser cavity, such that light can be emitted through the top aperture, and an electrode 11 can be electrically connected to the bottom reflector 6b. A further electrode 12 is electrically connected to the top reflector 6a. The reflectors comprise a laminate of highly reflecting InAlNSb superlattices, the top reflector 6a being doped, possibly with Be, to yield a p type semiconductor and the bottom reflector 6b being doped, possibly with Si, to yield an n type semiconductor. In this embodiment the top electrode 12 is gold. Both top and bottom electrodes 11 and 12 lead to the silicon substrate 7 where they can be connected to conventional Si based VLSI electronics.

Such sub-pixels can be fabricated by standard photolithography and etching techniques. Each sub-pixel is addressed with wires laid onto or behind the silicon substrate 7 wafer and connected to the respective electrodes 11, 12 by metal evaporation techniques as used in VLSI technology. The sub-pixels can be connected in a similar manner as standard LCD color TV display arrangements or the like for distributing the relevant signals suitable for creating an image. Silicon VLSI technology can be embedded in the substrate and could be used for receiving and routing the video signal. This is a particular advantage for producing a compact display.

Alternatively to the laser structure, a LED structure omitting the cavity reflectors 6a, 6b or a resonant cavity LED with a bottom reflector of about 99% reflectivity and a top reflector of about 90% or less reflectivity could be fabricated from the semiconductor system using the same alloy. In each case, three color sub-pixels are combined to form a full color pixel.

Figure 5A:
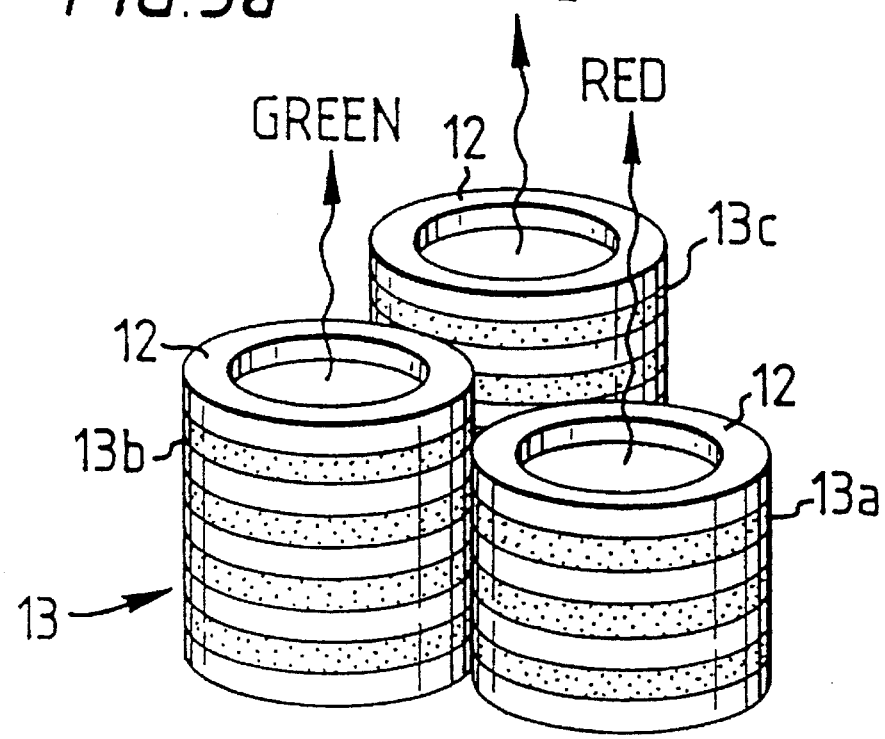
FIG. 5a shows a schematic diagram of 3 sub-pixels that form a red/blue/green assembly comprising a full color display pixel.
Figure 5B:
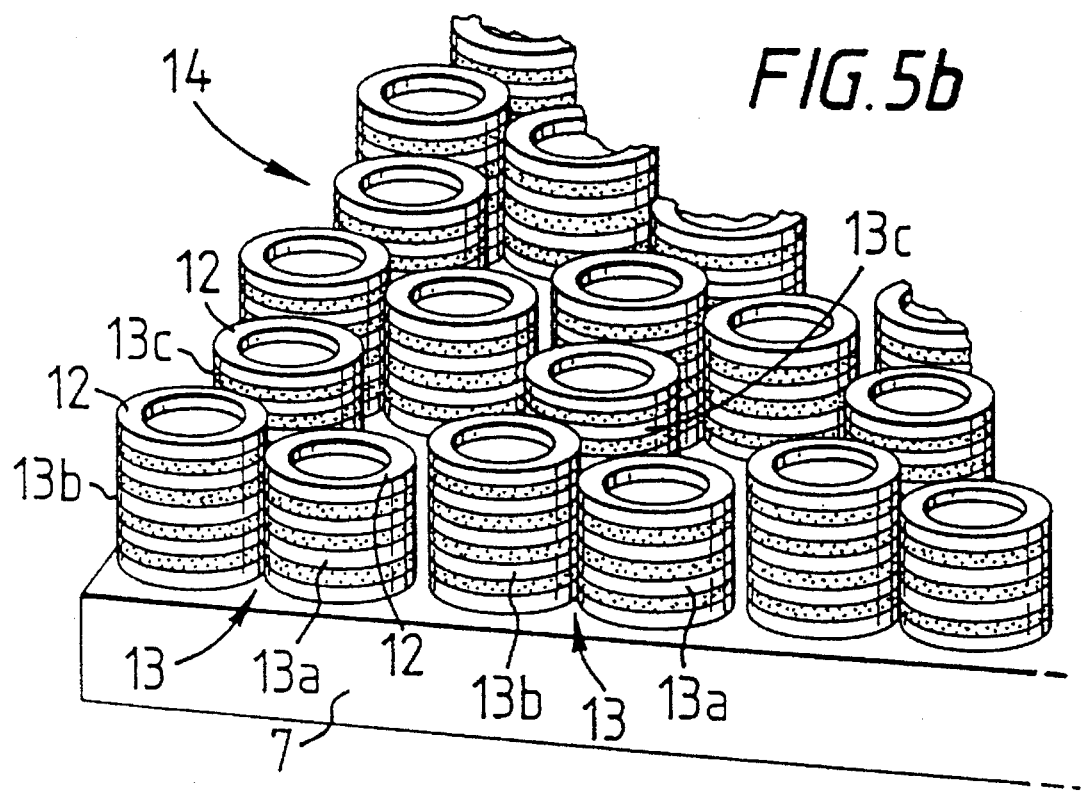
FIG. 5b shows a portion of an array of full color display pixels of FIG. 5a forming a full color flat panel display device.

FIG. 5(a) is a schematic diagram showing three sub-pixels 13a, 13b, 13c such as described earlier, each tuned to a red, green or blue wavelength and assembled into a full color pixel 13 suitable for use in a semiconductor display. Each sub-pixel is shown formed by a cylindrical cavity laser with a top ring contact 12, the individual sub-pixels being bundled together to form a full pixel. Such diameter pixels comprise sub-pixels having thicknesses which vary but are of the order of 1 µm, and diameters of approximately 30 µm and can be manufactured using existing technology. The full color pixels 13 comprising bundles of sub-pixels 13a, 13b, 13c can be arranged into an array 14 of full color pixels all fabricated on a silicon substrate 7 as shown in FIG. 5b.

Figure 5D:
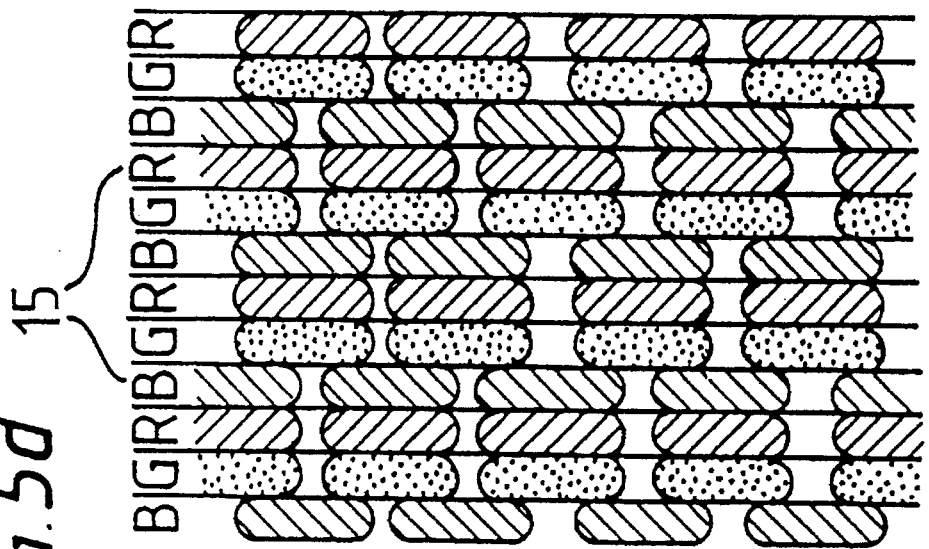
FIGS. 5c and 5d illustrate schematically other possible arrangements of sub-pixels in full color pixel arrays.
Figure 5C:
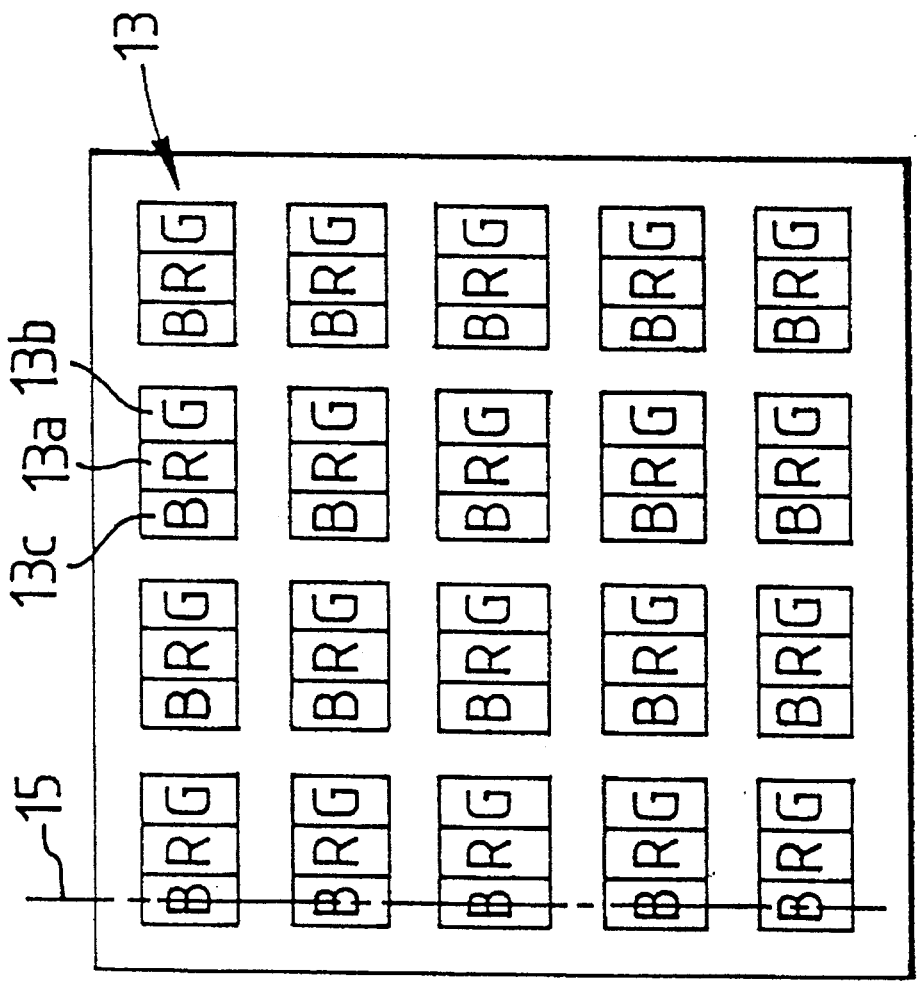

Other possible arrangements of individual pixels are shown in FIGS. 5c and 5d. In these Figures a full color pixel 13 again comprises a group of 3 sub-pixels 13a, 13b, 13c, each capable of emitting a different primary color, and each sub-pixel forms a part of a "column" 15 of sub-pixels capable of emitting the same color. A semiconductor display having such an arrangement of pixels would be more simple to fabricate using photolithography sequences than the arrangement shown in FIGS. 5a and 5b.

Such a full color pixel forms the basic unit of a color display and arrays of 1000×1000 pixels can easily be fabricated by standard photolithographic and etch techniques to provide a full color display suitable for use as a TV computer screen.

The way in which constituent elements are built to form such a full color display is illustrated schematically in FIG. 6. An individual quantum confined well, wire or dot structure 13a, built on a silicon substrate 7 forms part of a bundle of such structures 13 each individual structure emitting light having a wavelength corresponding to one of blue, green or red light and fabricated on a common substrate 7, which forms a full color pixel. The full color pixels 13 can be arranged into array 14, the array forming a, or a part of a, display screen 16. The display screen unit can be enclosed in a thin plastic film to protect the surface from damage. A typical pixel arrangement is for example, 480 rows×640 columns which is a standard 3 color LC-TV aspect ratio and format having a total of 921,600 sub-pixels. HDTV configuration is also possible.

If the display is to be used in a standard TV system or the like, the values of the emission wavelengths are usually chosen to satisfy the CIE chromaticity diagram, in order to produce a good "white" color.

Figure 7:
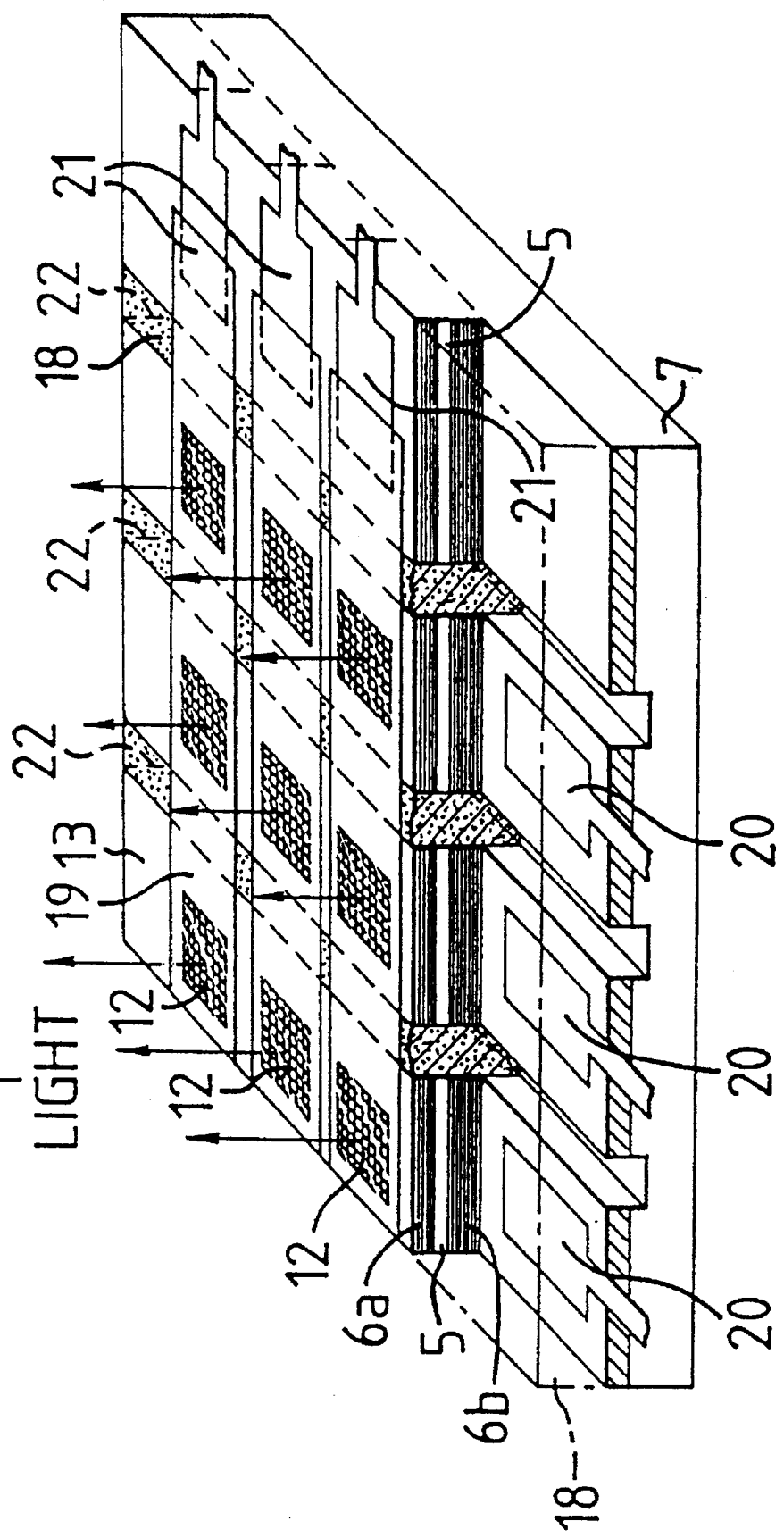
FIG. 7 illustrates how, typically a pixellated display according to the invention can be provided with a signal addressing scheme.

With reference to FIG. 7, a typical semiconductor display using display elements as hereinbefore disclosed, is described and comprises lasers constructed on a silicon substrate. The semiconductor material is pixellated using lithography and etching techniques in order to create row and column region pixels, each pixel containing at least 3 sub-pixel lasers whose output colors are red, green and blue respectively; such sub-pixellation is not illustrated in FIG. 7. The diametric dimension of a sub-pixel can be of the order of a few microns. A simple x-y matrix addressing scheme which is standard in flat panel T.V. construction can be used, and which is applicable here in the manner shown by accessing respective pixel column 20 and row 21 pads. Examples of two possible alternative addressing schemes are described hereinafter: (i) single x-y pixel interaction in which the brightness of each sub-pixel 13a, 13b, 13c is encoded in the signal sent to each pixel pad 20, 21 and decoded in VLSI located in the silicon substrate 7 at or near the pixel 13, respective control signals being then sent to the appropriate laser contacts 12; or (ii) a system in which both or one or other column or row pads are split into separate sections, one section for each sub-pixel of a pixel and three separate wires are connected to the respective split pixel pad sections and are thereby connected to the laser contact 12 of the appropriate sub-pixel to control color brightness.

Separation of adjacent columns of pixels can be achieved by forming isolation grooves 22 which extend into the substrate 7 and are then filled with dielectric material 18 to provide a flat top surface on which row drive lines 19 each connecting a row pad 21 to the contacts 12 of a pixel row can be formed. Alternatively, separation can be achieved by creating elongate isolation zones by ion implantation.

Figure 8:
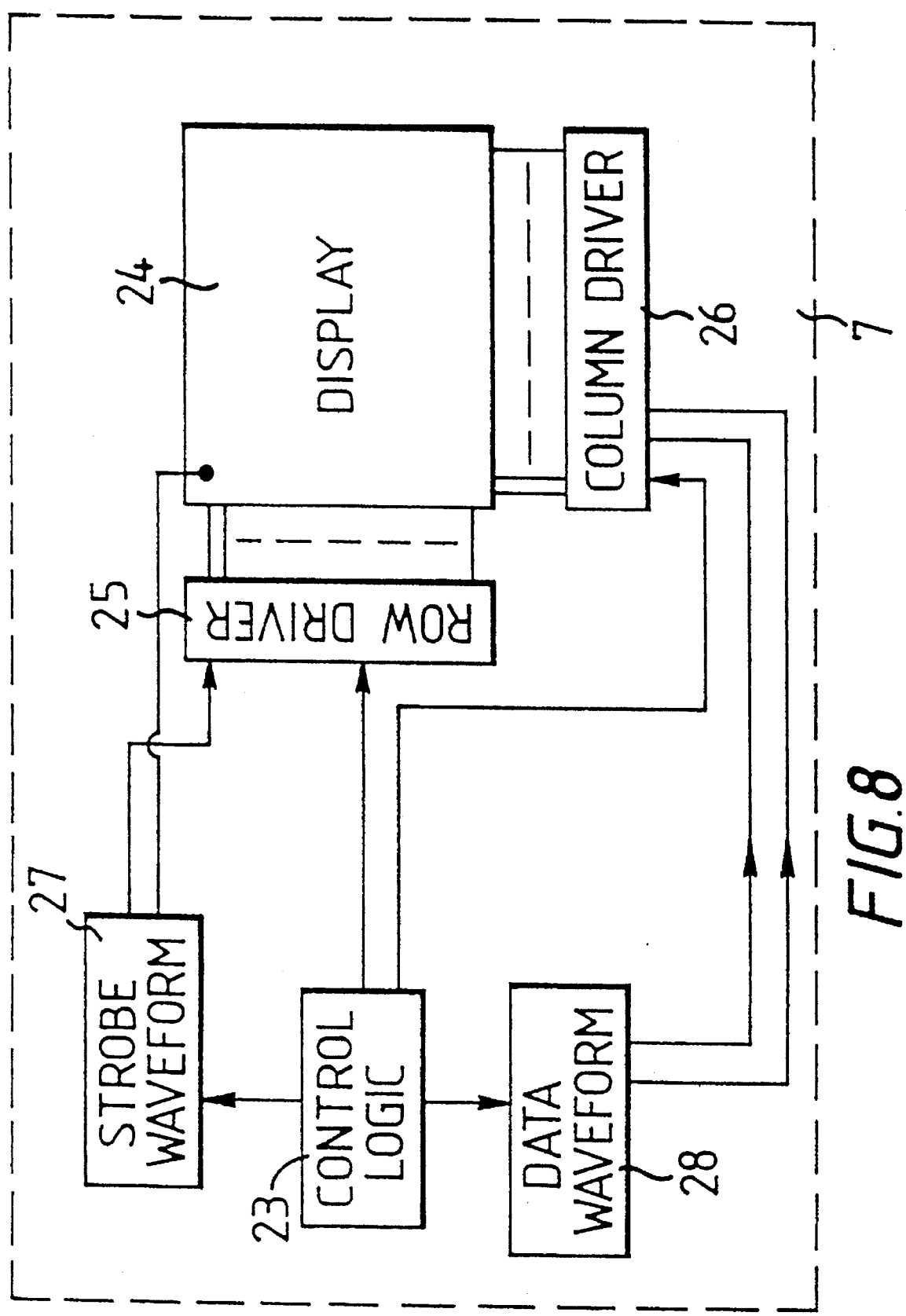
FIG. 8 illustrates, schematically a basic drive circuit for driving a display device according to the invention.

An example of a possible circuit for driving a display operated in accordance with one or other of the above addressing schemes is shown schematically in FIG. 8. In FIG. 8, row 25 and column 26 drivers apply voltage signals to the display 24. Two sets of waveforms are generated for supplying the row and column drivers 25, 26. A strobe wave form generator 27 supplies row waveforms, and a data waveform generator 28 supplies ON and OFF waveforms to the column driver 26. Overall control of timing and display format is controlled by a control logic unit 23. Not only the display array 24, but also the control electronics can be integrally formed on a common substrate 7.

Such a semiconductor display can be fabricated in the following fashion employing generally known techniques, with reference to FIG. 9. A silicon substrate 7 already formed with the appropriate VLSI electronics for T.V. receiving and display control signal generation is coated with silicon dioxide (not shown in FIG. 9) to form a semi-insulating layer. Then a stack of layers 29 alternately InNSb and AlNSb are deposited on the silicon dioxide to form an InAlNSb superlattice, which provides a very short period quantum well/barrier structure. These stacked layers will eventually form the bottom reflectors 6b in the finished sub-pixels. The InNSb layers can be doped with an impurity such as Si during their deposition to yield a n type semiconductor. The layers which will form the barrier layers 5b of AlNSb and the well layer 5a of InNSb of each of the quantum well regions 5 in the finished sub-pixels are then deposited. These are layers 30, 31, respectively. Though only one is shown in FIG. 9, three different quantum well regions are deposited one on top of the other, each quantum well region being adapted to emit light of a different primary color from the primary color emitted by the other quantum well regions.

It is possible to employ the InAlSbN alloy for only the blue emitting one of these three quantum well regions. The other two, namely red and green emitting, quantum well regions may be made from other alloy systems. However, the use of similar alloys in all three quantum well regions is preferred as it simplifies the fabrication process.

Figure 9A:
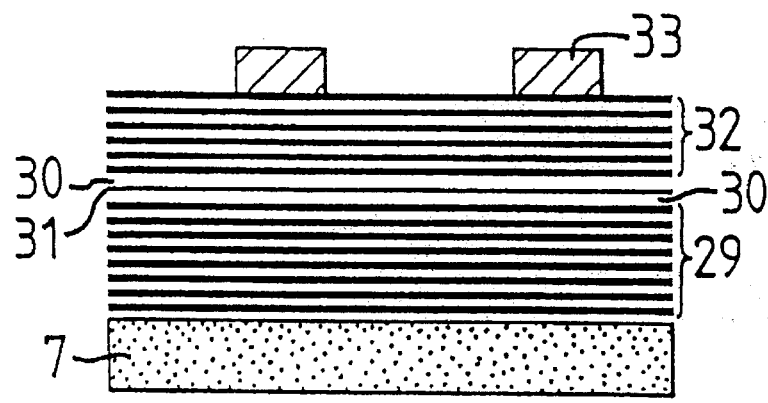
FIGS. 9a–9h show a schematic sequence of steps for the manufacture of a pixellated array.
Figure 9B:
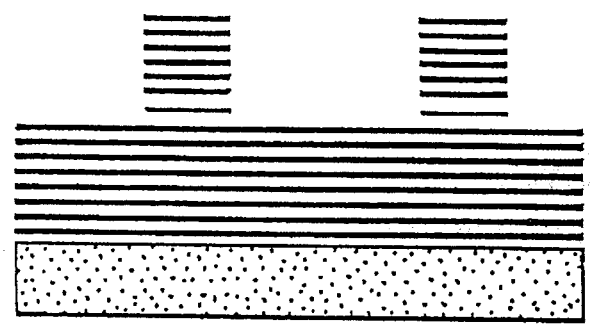

Next, a further stack of layers 32 alternately InNSb and AlNSb are deposited over the quantum well active region layers 30, 31 thereby forming a further InAlSbN superlattice. The InNSb layers are doped with an impurity such as Be to yield a p type semiconductor. The technique used to deposit the materials onto the Silicon substrate is typically Molecular Beam Epitaxy (MBE). Once the respective layers have been deposited, photo lithography and etch techniques employing photoresist 33 are used to form an array of individual sub-pixel lasers, as shown in FIG. 9(b).

This stage is essentially a three stage process. Three different mask patterns are used in sequence, each one exposing areas of the top layer region corresponding to the location of one type of color emitting laser. Etching is carried out for respective mask patterns, to a depth corresponding to the respective quantum well region adapted to emit light of the color corresponding to the respective mask pattern. The resulting individual laser elements are schematically shown in FIG. 9(b).

Figure 9C:
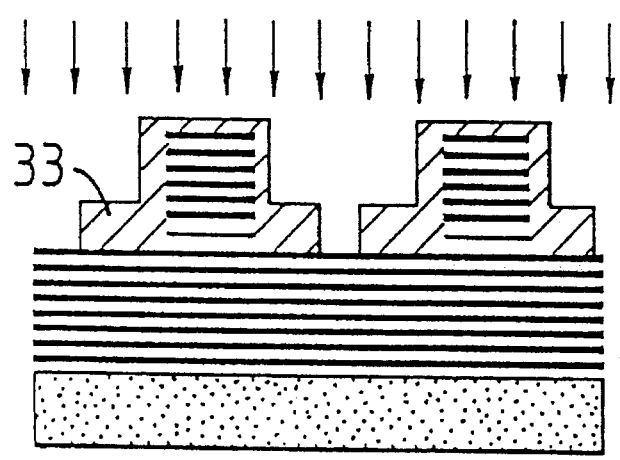
Figure 9D:
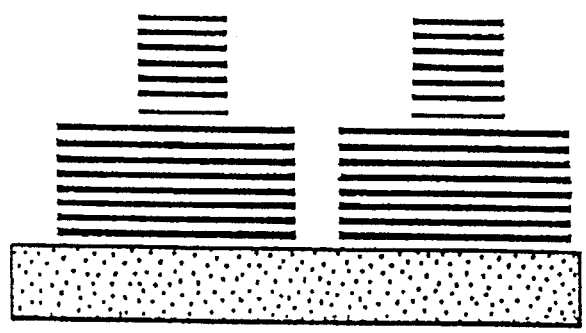
Figure 9E:
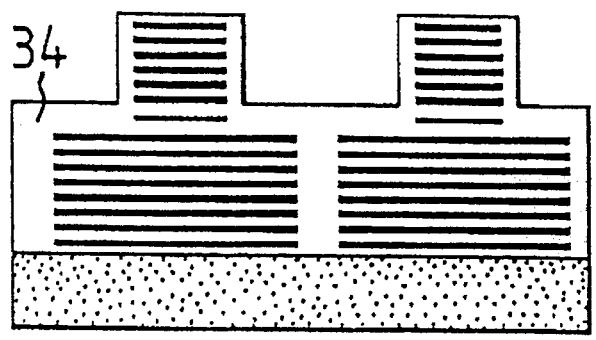
Figure 9F:
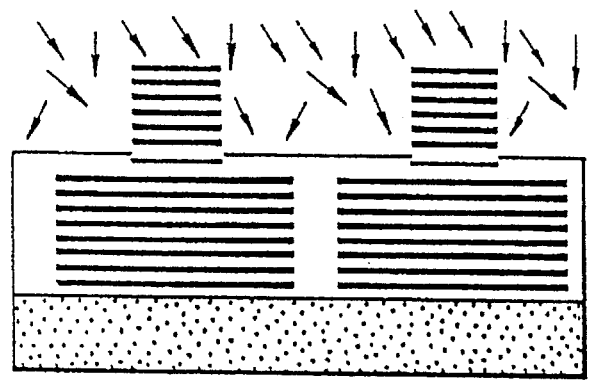
Figure 9G:
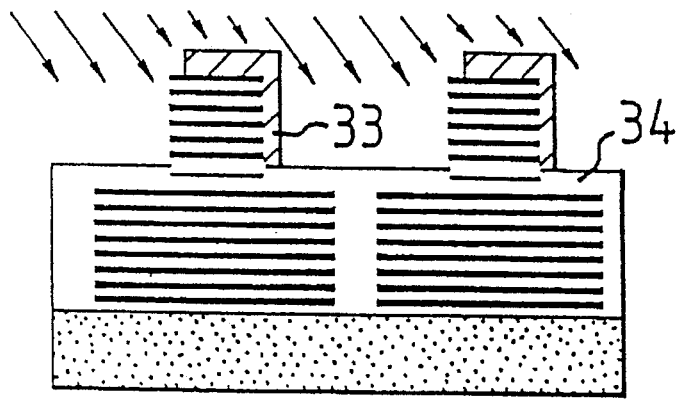
Figure 9H:
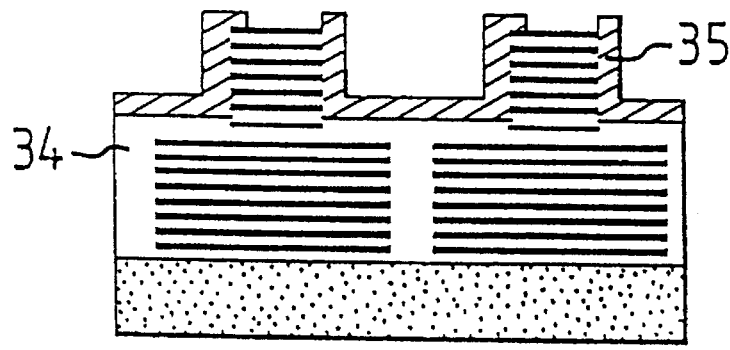

Then all the individual laser elements are masked off as shown in FIG. 9(c), and ion etching is carried out to separate the individual laser elements as shown in FIG. 9(d). The bottom contacts are then deposited on to the laser element, such that the lower exposed barrier region of respective laser elements are contacted. Then a polyimide layer 34 is deposited over and between the individual laser elements, as shown in FIG. 9(e). Then oxy-plasma etching exposes the upper laser contact as shown in FIG. 9(f). Photo-resist 33 is deposited over the upper laser contacts and gold 35 is deposited over the laser contacts as shown in FIGS. 9(g) and 9(h).

An important aspect of any display is the display luminance and its corresponding power consumption. These are calculated here below for a sub-pixel having a vertical laser cavity structure. For such a structure, the active region size is typically a 100 Å quantum well having a diameter of 30 microns. Such an emitter in AlInNSb would consume approximately 1 micro amp, and have a resistivity at worst ~$10^{-6}$ ohms, yielding a power consumption of approximately 1 micro watt. A million element display will therefore consume approximately one watt, excluding display driving circuitry.

The luminance of such a structure, would be approximately 0.2 milli lumens based on 30% quantum efficiency at worst, and yield a worst emission of ~0.03 milli candela at a green wavelength.

Typically, normal TV has a luminance of 200 candela/meter$^2$. Therefore, each of the million pixels in, for example, a 8×6 cm palm-sized color semiconductor display screen must output $10^{-6}$ candela, which is nearly one and a half orders of magnitude less than the 0.03 milli candela expected from a vertical cavity laser. At red and blue wavelengths, between one and two orders of magnitude more emission is needed from each sub-pixel to satisfy the CIE color response and balance. Clearly, the approximately one and a half orders extra available from the laser can satisfy this need.

Figure 10:
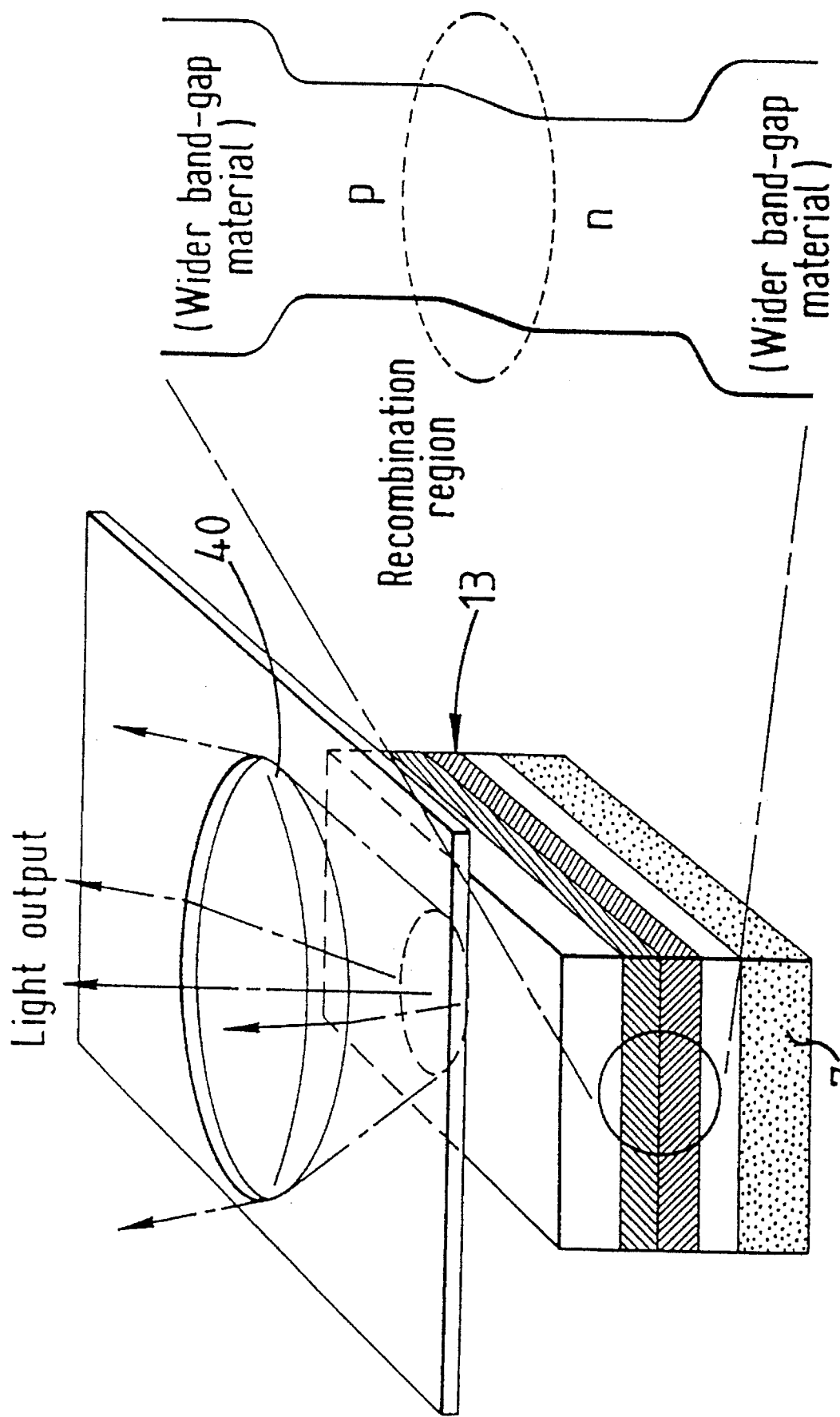
FIG. 10 shows how a microlens may be placed over each pixel to enhance the apparent brightness of the display by restricting the emission solid angle.

These calculations are for worst case values. However, if the emission was found to be deficient by one or two orders of magnitude, then use of an array of quantum dots to make up a single sub-pixel or a different, lower resistivity, semiconductor material could restore the performance requirements to those necessary for a successful screen display. In addition, as shown in FIG. 10, an array of microlenses can be provided, each microlens 40 being placed over a corresponding pixel 13 in order to enhance the apparent brightness of the display. The apparent enhancement of the brightness of the display is due to the lens reducing the solid angle over which light is emitted and hence more light is projected towards the viewer.

The invention is not limited to the foregoing specific embodiment, and a number of alternative structures and applications and materials are envisaged. The quantum well active layer material, for example, can be lattice matched to a GaP wafer substrate relatively easily without having to make major changes to the nitride alloy, since GaP has a similar lattice constant to silicon. The structure of the optoelectronic devices can also be varied to increase the band-gap energy by decreasing the dimensions of the quantum confinement. This would result in the quantum wire and quantum dot structures mentioned earlier. Another type of optoelectronic device that can be used is the so-called "thresholdless laser", which would reduce the power consumption of each sub-pixel and hence result in a very low power display.

Although the specific embodiment described hereinbefore relates to a full color display, it will be evident to the skilled addressee that the complementary characteristics of the light emitting elements could be utilised to form a full color light detector.

Industrial applications of the invention include not only TV or HDTV displays, wrist watches and telephone displays or cameras, but general display/detector types and also 3-D and virtual reality displays which require fast response times. Other applications are in low power displays such as those used in portable TV's, mobile telephones or videophones. A particularly useful application for short wavelength emitters (i.e. blue or U-V) is in high density optical storage systems.

The invention is also applicable to image formation in Optoelectronic Neural Network systems and pattern recognition systems.

The invention being thus described, it will be obvious that the same may be varied in many ways. Such variations are not to be regarded as a departure from the scope of the invention.

There are described above novel features which the skilled man will appreciate give rise to advantages. These are each independent aspects of the invention to be covered by the present application, irrespective of whether or not they are included with the scope of the following claims.

What is claimed is:

1. A color semiconductor display/detector having a plurality of optoelectronic elements, said plurality including a first element and a second element, said first and second elements being capable of emitting/absorbing light having respective different predetermined wavelengths in the range corresponding to visible light, wherein said first and second optoelectronic elements are formed on a common substrate, and comprise III-V nitride alloy compositions, said compositions being substantially lattice matched to said common substrate.

2. A color semiconductor display/detector as claimed in claim 1, wherein said substrate comprises one of silicon (Si) and Gallium Phosphide (GAP).

3. A color semiconductor display/detector as claimed in claim 1, wherein said III-V nitride alloy comprises one of INAINSb and AlGaAsSbN.

4. A color semiconductor display/detector as claimed in claim 3 wherein said optoelectronic elements are each made from quaternary InAlNSb alloy, and each include an active quantum well region comprising InNSb confined by a barrier comprising AlNSb.

5. A color semiconductor display/detector as claimed in claim 3, wherein said optoelectronic elements are each made from quinternary AlGaAsSbN alloy, and each include an active quantum well region comprising GaAsN confined by a barrier comprising AlNSb.

6. A color semiconductor display/detector as claimed in claim 4, wherein said barrier comprises $AlN_{1-x}Sb_x$ where x lies in the range $0.57 \leq x \leq 0.63$, and said active quantum well region comprises $InN_{1-y}Sb_y$ where y lies in the range $0.32 \leq y \leq 0.38$.

7. A color semiconductor display/detector as claimed in claim 5, wherein said barrier comprises $AlN_{1-x}Sb_x$ where x lies in the range $0.57 \leq x \leq 0.63$, and said active quantum well region comprises $GaAs_{1-z}N_z$ where z lies in the range $0.17 \leq z \leq 0.23$.

8. A color semiconductor display/detector as claimed in claim 6, wherein the wavelength of light emitted/absorbed by an individual said optoelectronic element is predetermined by doping the active quantum well regions of said individual optoelectronic element with Al.

9. A color semiconductor display/detector as claimed in claim 6, wherein the wavelength of light emitted/absorbed by an individual optoelectronic element is predetermined by the size of the active quantum well region.

10. A color semiconductor display/detector as claimed in claim 1, wherein the optoelectronic elements comprise quantum confinement type structures selected from the group consisting of lasers, LEDs, wires and dots.

11. A color semiconductor display/detector as claimed in claim 1, wherein said first and second optoelectronic elements each form a part (sub-pixel) of a group (pixel) of such elements, and are each adapted to emit/absorb light at a wavelength of a respective primary color.

12. A color semiconductor display/detector as claimed in claim 11, wherein the group comprises three said optoelectronic elements, each of which is adapted to emit/absorb light of a different respective primary color, namely red, green or blue.

13. A color semiconductor display/detector as claimed in claim 11, comprising an array of said groups of individual optoelectronic elements.

14. A color semiconductor display/detector as claimed in claim 13, wherein said array is adapted for use as a display for a TV, a computer and for use as an image detector.

15. A color semiconductor display/detector as claimed in claim 11, wherein light emitted from each individual optoelectronic element has a wavelength corresponding to that defined by the CIE chromaticity diagram for the respective primary color emitted from that element.

16. A color semiconductor display/detector as claimed in claim 1, including processing, control and drive circuitry for said display/detector, said circuitry being located on said common substrate.

17. A color semiconductor display/detector as claimed in claim 16, said processing circuitry being adapted to process TV signals and drive said display/detector in accordance therewith, thereby forming a substantially planar, thin and compact TV receiver/transmitter and display/camera.

18. A color semiconductor display/detector according to claim 1 wherein at least one of said optoelectronic elements is a blue light emission/absorption element and comprises a said III-V nitride alloy composition which includes Sb.

19. An optoelectronic element comprising a III-V nitride alloy capable of being substantially lattice matched to at least one of Si and GaP, and of being selectively adapted to emit/absorb light at a desired wavelength in the visible red to ultra-violet region of the electromagnetic spectrum, said element having an active region comprising InNSb.

20. An optoelectronic element according to claim 19 wherein said active region comprises $InN_{1-y}Sb_y$ where y lies in the range $0.32 \leq y \leq 0.38$.

21. An optoelectronic element as claimed in claim 19, wherein said active region comprises an active quantum well of InNSb, and barrier regions of AlNSb.

22. An optoelectronic element as claimed in claim 21 wherein said barrier regions comprise $AlN_{1-x}Sb_x$ where x lies in the range $0.57 \leq x \leq 0.63$.

23. An optoelectronic element comprising a III-V nitride alloy capable of being substantially lattice matched to at least one of Si and GaP, and of being selectively adapted to emit/absorb light at a desired wavelength in the visible red to ultra-violet region of the electromagnetic spectrum, said element having an active region comprising an active quantum well region of GaAsN and barrier regions of AlNSb.

24. An optoelectronic element as claimed in claim 23, said quantum well region comprising $GaAs_{1-z}N_z$ where z lies in the range $0.17 \leq z \leq 0.23$, and said barrier regions comprising $AlN_{1-x}Sb_x$ where x lies in the range $0.57 \leq x \leq 0.63$.

25. An optoelectronic element as claimed in claim 19, wherein an emission/absorbtion wavelength of said element is selected by at least one of doping said active region with Al and quantum confining said active region.

26. A nitride alloy comprising $InN_{1-y}Sb_y$ where y lies in the range $0.32 \leq y \leq 0.38$.

27. A nitride alloy comprising $AlN_{1-x}Sb_x$ where x lies in the range $0.57 \leq x \leq 0.63$.

28. A blue light emitting/absorbing optoelectronic element comprising a III-V nitride alloy capable of being substantially lattice matched to at least one of Si and GaP, said III-V nitride alloy comprising one of InAlNSb and AlGaAsSbN.

29. A full color semiconductor display device comprising a single substrate and an array of electroluminescent light emitting elements, formed on said single substrate, wherein the materials forming said elements are substantially lattice matched to the crystal structure of the substrate and wherein said array comprises red, green and blue electroluminescent elements formed of substantially similar III-V nitride alloy compositions tuned for their respective emission wavelengths by at least one of quantum confinement incorporation and by doping variation.

30. A full color semiconductor display device as claimed in claim 29 wherein the substrate comprises one of silicon and gallium phosphide, and wherein said III-V nitride alloy comprises one of InAlNSb and AlGaAsSbN.

31. A full color semiconductor display device as claimed in claim 30 wherein said light emitting elements are each made from InAlNSb alloy, and each include an active quantum well region comprising InNSb confined by a barrier comprising AlNSb.

32. A full color semiconductor display device as claimed in claim 30 wherein said light emitting elements are each made from AlGaAsSbN alloy, and each include an active quantum well region comprising GaAsN confined by a barrier comprising AlNSb.

33. A full color semiconductor display device as claimed in claim 29, wherein said electroluminescent elements each comprise a vertical cavity laser of double heterojunction configuration, said laser including a quantum confinement structure having an active region between two barrier regions, and first and second reflectors on opposite sides of said quantum confinement structure, said vertical cavity laser being oriented with said reflectors spaced apart in a direction perpendicular to the plane of the substrate so that light is emitted transverse to said plane.

34. A full color semiconductor display device according to claim 29 including an array of microlenses superposed over the substrate with each individual microlens formed and positioned so as to reduce the solid angle over which light emitted from a corresponding electro luminescent element is projected from the device.

* * * * *